US012644937B2

(12) United States Patent
Ding

(10) Patent No.: US 12,644,937 B2
(45) Date of Patent: Jun. 2, 2026

(54) MAGNETIC FORCE MEASURING DEVICE

(71) Applicant: SOPH International Limited, Road Town (GB)

(72) Inventor: Hong Ding, Jiaxing (CN)

(73) Assignee: SOPH International Limited, Road Town (GB)

( * ) Notice: Subject to any disclaimer, the term of this patent is extended or adjusted under 35 U.S.C. 154(b) by 260 days.

(21) Appl. No.: 18/684,720

(22) PCT Filed: May 11, 2022

(86) PCT No.: PCT/CN2022/092278
§ 371 (c)(1),
(2) Date: Feb. 19, 2024

(87) PCT Pub. No.: WO2023/020035
PCT Pub. Date: Feb. 23, 2023

(65) Prior Publication Data
US 2024/0353509 A1 Oct. 24, 2024

(30) Foreign Application Priority Data

Aug. 19, 2021 (CN) .......................... 202110952516.6

(51) Int. Cl.
*G01R 33/12* (2006.01)
*G01L 1/02* (2006.01)
*G01L 5/00* (2006.01)
(52) U.S. Cl.
CPC ................ *G01R 33/12* (2013.01); *G01L 1/02* (2013.01); *G01L 5/0004* (2013.01)

(58) Field of Classification Search
CPC ......... G01L 5/0004; G01L 1/02; G01R 33/02; G01R 33/12
See application file for complete search history.

(56) References Cited

U.S. PATENT DOCUMENTS

| 4,392,305 | A | * | 7/1983 | Nix | ........................ | G01B 7/105 |
| | | | | | | 324/230 |
| 5,006,799 | A | * | 4/1991 | Pfanstiehl | .............. | G01B 7/105 |
| | | | | | | 324/230 |

(Continued)

FOREIGN PATENT DOCUMENTS

| CN | 106500898 A | 3/2017 |
| CN | 108760097 A | 11/2018 |

(Continued)

*Primary Examiner* — Paul M. West
(74) *Attorney, Agent, or Firm* — Bayramoglu Law Offices LLC

(57) ABSTRACT

A magnetic force measuring device includes a measuring body and a pressure gage. A center of the measuring body is provided with a longitudinal channel. A lifting system, an intermediate system, and a jacking block are arranged in the longitudinal channel. The pressure gage is associated with the intermediate system. Bottom surfaces of the measuring body and the jacking block are flush to form a same contact surface in contact with a magnetic module. One of the measuring body and the jacking block is magnetically conductive, and the other is not magnetically conductive. When subjected to an external action force, the lifting system can drive the intermediate system to move up or down in the longitudinal channel, to lift the jacking block upward or push the jacking block to jack up the measuring body. The pressure gage records a maximum stress value of the jacking block.

18 Claims, 3 Drawing Sheets

(56)  References Cited

U.S. PATENT DOCUMENTS

2014/0224003  A1*  8/2014  Zhang ..................... G01N 3/42
                                                      73/82
2017/0052080  A1*  2/2017  Li ........................ G01M 17/08

FOREIGN PATENT DOCUMENTS

CN        110887593  A      3/2020
CN        111473902  A      7/2020
CN        113534026  A     10/2021
KR        101979436  B1     5/2019

* cited by examiner

MAGNETIC FORCE MEASURING DEVICE

CROSS REFERENCE TO THE RELATED APPLICATIONS

This application is the national phase entry of International Application No. PCT/CN2022/092278, filed on May 11, 2022, which is based upon and claims priority to Chinese Patent Application No. 202110952516.6, filed on Aug. 19, 2021, the entire contents of which are incorporated herein by reference.

TECHNICAL FIELD

The present disclosure relates to the field of magnetic force measurement, and in particular, to a magnetic force measuring device.

BACKGROUND

At present, magnetic modules are widely used in various fields of machinery and transportation. In many scenarios, it is necessary to accurately measure a magnetic force of the magnetic module to meet engineering requirements. Usually, a spring scale is used to directly pull up a test workpiece against magnetic clamping force during the magnetic force measurement. In the prior art, when the spring scale is used to directly pull up the test workpiece, the speed at which each person lifts the test workpiece is inevitably different due to individual differences, and even the same person cannot keep a completely consistent lifting speed at different time points. Therefore, obtained results vary from person to person when the spring scale is used to directly pull up the test workpiece to perform the magnetic force measurement, and the spring scale cannot capture and display a maximum value, making it impossible to obtain the most accurate measurement results.

Therefore, it is desirable to design a more accurate magnetic force measuring device to better meet requirements of engineering and safety.

SUMMARY

The present disclosure discloses a magnetic force measuring device, including a measuring body and a pressure gage. A center of the measuring body is provided with a longitudinal channel. A lifting system, an intermediate system, and a jacking block are arranged in the longitudinal channel from top to bottom. The pressure gage is associated with the intermediate system. A bottom surface of the measuring body and a bottom surface of the jacking block are flush to form a same contact surface in contact with a magnetic module. One of the measuring body and the jacking block is magnetically conductive, and the other is not magnetically conductive. When subjected to an external action force, the lifting system can drive the intermediate system to move up or down in the longitudinal channel, so as to apply a force to the jacking block to lift the jacking block upward or push the jacking block to jack up the measuring body. The pressure gage records a maximum stress value of the jacking block.

Further, the lifting system includes a circlip and a screw rod, and the screw rod allows a wrench to reach in to apply an external force.

Preferably, the screw rod is a screw rod with a hexagon socket head, and the wrench is a hex wrench.

In a preferred implementation, the pressure gage is a memory pressure gage, the intermediate system includes a pressing block, a spring connected to a lower end of the pressing block, and hydraulic oil, the longitudinal channel between the pressing block and the jacking block forms a seal chamber, the seal chamber is filled with the hydraulic oil, and the seal chamber is communicated with the memory pressure gage; and when the pressing block is stressed and pushed downward, a hydraulic pressure in the seal chamber is transmitted to the memory pressure gage, such that the memory pressure gage obtains the maximum stress value.

Preferably, one or more sealing rings are arranged on an outer side of the pressing block, and one or more sealing rings are arranged on an outer side of the jacking block.

Further, a lower portion of the seal chamber is provided with a through hole communicated with an external space of the measuring body, and the through hole is sealed by a plug.

Preferably, the seal chamber is an inversely T-shaped seal chamber.

In a preferred implementation, the pressure gage is an electronic pressure gage, and the intermediate system includes a pressing block, a screw, and a pressure sensor; an upper portion of the pressing block wraps a lower portion of the screw, and the pressure sensor is arranged below the screw; each of an upper end and a lower end of the pressure sensor is provided with a threaded column, and a lower portion of the pressing block wraps the threaded column at the upper end of the pressure sensor; and the electronic pressure gage is connected to the pressure sensor to obtain the maximum stress value.

Further, the electronic pressure gage is provided with a digital display screen to display the maximum stress value.

Preferably, when the measuring body is magnetically conductive and the jacking block is not magnetically conductive, the measuring body is made of low carbon steel, and the jacking block is made of brass; when the measuring body is not magnetically conductive and the jacking block is magnetically conductive, the measuring body is made of brass, and the jacking block is made of low carbon steel.

In the magnetic force measuring device according to the present disclosure, the bottom surface of the measuring body and the bottom surface of the jacking block are flush and form the same contact surface in contact with the magnetic module. When the lifting system is subjected to a downward pressing force, the lifting system pushes the intermediate system to move downward, and thus pushes the jacking block to press a working surface of the magnetic module downward. Due to interaction of forces, when a received reaction force may cancel out a magnetic force and gravity of the measuring body itself, the measuring body is jacked up upward, such that a magnitude of the required reaction force can be recorded to obtain a maximum stress value, and thus an accurate magnetic force value is obtained by calculation; or when the lifting system is subjected to an upward lifting force, the lifting system drives the intermediate system to move upward, to pull the jacking block upward to cancel out the magnetic force and the gravity of the jacking block itself and leave the contact surface. At this time, a magnetic force value can be obtained through calculation based on a measured and recorded maximum stress value. In the present disclosure, when a user uses the hex wrench to rotate the screw rod which has a hexagon socket head, rotation at a uniform speed can be easily achieved, and the pressing force or the lifting force can be applied stably. Therefore, an influence of different operators, times or places on measurement results is avoided, an accurate magnetic force measured value can be obtained, and thus the device has a very high practical value in practice.

In order to make the above contents of the present disclosure more understandable, preferred implementations are described in detail below with reference to accompanying drawings.

BRIEF DESCRIPTION OF THE DRAWINGS

The present disclosure is described below with reference to accompanying drawings.

DESCRIPTION OF REFERENCE SIGNS

Figure 1:
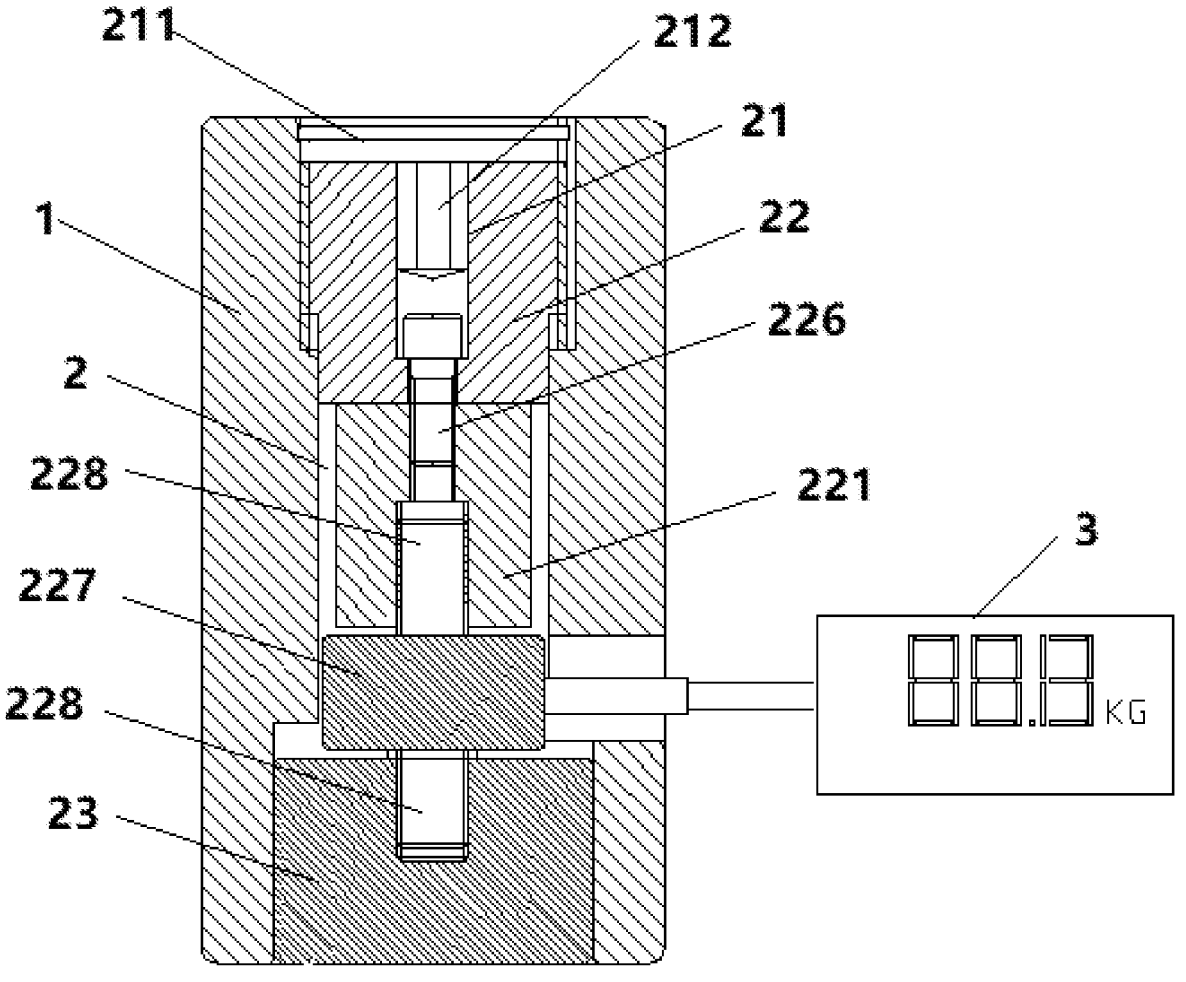
FIG. 1 is a schematic sectional view of a magnetic force measuring device according to a first implementation of the present disclosure.

Measuring body 1; longitudinal channel 2; pressure gage 3; magnetic module 4;
lifting system 21; circlip 211; screw rod 212;
intermediate system 22; pressing block 221; spring 222; hollow spring pin 223; sealing ring 224; plug 225;
screw 226; pressure sensor 227; threaded column 228; hydraulic oil 229; jacking block 23; seal chamber 24.

DETAILED DESCRIPTION OF THE EMBODIMENTS

The implementations of the present disclosure are described below by means of specific implementations, and those skilled in the art can easily understand other advantages and effects of the present disclosure from the contents disclosed in this description.

Exemplary implementations of the present disclosure are described below with reference to the accompanying drawings. However, the present disclosure can be implemented in many different forms and is not limited to the implementations described herein. The implementations are provided to thoroughly and completely understand the present disclosure, and fully convey the scope of the present disclosure to those skilled in the art. The terms in the exemplary implementations in the accompanying drawings are not a limitation of the present disclosure. In the accompanying drawings, the same units/elements are designated by same reference signs.

Unless otherwise specified, the terms (including scientific and technical terms) used herein have the same meanings as those commonly understood by those skilled in the art. In addition, it can be understood that the terms defined in commonly used dictionaries should be interpreted as having the same meanings as the contextual meanings in the related technical field, and should not be interpreted as having idealized or overly formal meanings.

First Implementation

As shown in FIG. 1, the first implementation of the present disclosure discloses a magnetic force measuring device, including measuring body 1 and pressure gage 3. A center of the measuring body 1 is provided with longitudinal channel 2 in an axial direction thereof. Lifting system 21, intermediate system 22, and jacking block 23 are arranged inside the longitudinal channel 2 from top to bottom. The pressure gage 3 is associated with the intermediate system 22. A bottom surface of the measuring body 1 and a bottom surface of the jacking block 23 are flush to form a same contact surface in contact with a magnetic module. One of the measuring body 1 and the jacking block 23 is magnetically conductive, and the other is not magnetically conductive. When subjected to an external action force, the lifting system 21 can drive the intermediate system 22 to move up or down in the longitudinal channel 2, so as to apply a force to the jacking block 23 to lift the jacking block 23 upward or push the jacking block 23 to jack up the measuring body 1, and the pressure gage 3 records a maximum stress value of the jacking block 23.

Specifically, the pressure gage 3 of this implementation is an electronic pressure gage, and the electronic pressure gage is provided with a digital display screen, which can perform digital display and display a measured magnitude of a magnetic force more visually, with lower requirements for an operator and more convenient measurement. The intermediate system 22 includes pressing block 221, screw 226, and pressure sensor 227. An upper portion of the pressing block 221 wraps a lower portion of the screw 226, and the pressure sensor 227 is arranged below the screw 226. Each to an upper end and a lower end of the pressure sensor 227 is provided with threaded column 228. A lower portion of the pressing block 221 wraps the threaded column 228 at the upper end of the pressure sensor 227, and the electronic pressure gage is connected to the pressure sensor 227 to obtain the maximum stress value.

The pressure sensor 227 is usually formed by a pressure-sensitive element and a signal processing unit, and the pressure sensor 227 can sense a pressure. The two ends of the pressure sensor 227 are provided with the threaded columns. When action forces facing each other are applied to the threaded columns at the two ends, the pressure sensor can measure a pressure. When action forces facing away from each other are applied to the threaded columns at the two ends, the pressure sensor can measure a pulling force. The pressure sensor 227 can convert a magnitude of a stress into a corresponding electrical signal for output. The pressure gage 3 in this implementation is an electronic pressure gage, and the electronic pressure gage may be placed outside the measuring body (as shown in FIG. 1) or embedded in the measuring body as required.

In the magnetic force measuring device according to this implementation, one of the measuring body 1 and the jacking block 23 is magnetically conductive, while the other is not magnetically conductive. If the measuring body and the jacking block are both made of a magnetically conductive material, because of a small gap therebetween, the two are clamped together by magnetic force, and an attraction force affects a final measurement result.

In the magnetic force measuring device according to this implementation, when the measuring body 1 is made of a magnetically conductive material and the jacking block 23 is made of a non-magnetically conductive material, if the magnetic force measuring device according to the present disclosure is placed on a working surface of the magnetic module, the measuring body 1 and the magnetic module are clamped together by magnetic force. During measurement, a downward pressing force is applied to the lifting system 21 to push the pressing block 221 of the intermediate system 22 to apply a pressure downward. The lower portion of the pressing block 221 wraps the threaded column 228 at the upper end of the pressure sensor 227, such that the threaded columns 228 at the two ends of the pressure sensor 227 may be subjected to action forces facing each other. The pressure sensor 227 senses the pressure and convert the pressure into an electrical signal for output to the electronic pressure gage, and the digital display screen (such as a liquid crystal or light-emitting diode (LED) display screen) of the electronic pressure gage converts the input electrical signal into a pressure value for digital display.

As the pressing block 221 continues to move downward, the jacking block 23 is subjected to a downward pressing force, such that the jacking block 23 presses the magnetic module tightly, and the bottom surface of the measuring body 1 is subjected to an upward reaction force. When the reaction force is enough to cancel out a magnetic attraction force between the measuring body 1 and the magnetic module and the gravity of the measuring body 1 itself, the magnetic measuring body 1 is lifted upward. At this time, the pressure sensor 227 obtains a maximum stress, such that the electronic pressure gage measures a maximum stress value and digitally displays the maximum stress value by means of the digital display screen. A magnetic force value can be obtained through calculation based on the maximum stress value.

When the measuring body 1 is made of a non-magnetically conductive material and the jacking block 23 is made of a magnetically conductive material, the bottom surface of the measuring body 1 is flush with the bottom surface of the jacking block 23 to form the same contact surface in contact with the magnetic module. When the magnetic force measuring device according to the present disclosure is placed on the working surface of the magnetic module, the jacking block 23 and the magnetic module are clamped together by magnetic force.

During measurement, an upward lifting force is applied to the lifting system 21, and a step of the lifting system 21 drives the screw 226 of the intermediate system 22 to move upward in the axial direction of the longitudinal channel 2. During the upward movement of the screw 226, the pressing block 221 wrapping the lower portion of the screw 226 is driven to lift upward. Since the lower portion of the pressing block 221 wraps the threaded column 228 at the upper end of the pressure sensor 227, a lifting force may be applied to the threaded column 228, such that the threaded columns at the two ends of the pressure sensor 227 are subjected to action forces facing away from each other. The pressure sensor 227 senses a pulling force pressure and convert the pulling force into an electrical signal for output to the electronic pressure gage, and the digital display screen (such as a liquid crystal or LED display screen) of the electronic pressure gage converts the input electrical signal into a pulling value for digital display.

As the pressing block 221 continues to move upward, the jacking block 23 is subjected to a continuously increasing upward lifting force. When the stress on the jacking block 23 is enough to cancel out the magnetic attraction force between the jacking block 23 and the magnetic module and the gravity of the jacking block 23 itself, the jacking block 23 is lifted upward away from the contact surface. At this time, the pressure sensor 227 obtains a maximum stress, such that the electronic pressure gage measures a maximum stress value and digitally displays the maximum stress value by means of the digital display screen. A magnetic force value can be obtained through calculation based on the maximum stress value.

In the whole process mentioned above, the magnetic module needs to be kept stationary, such that there is accurate relative motion between the magnetic force measuring device and the magnetic module, to avoid affecting accuracy of results.

When the test is completed, the lifting system 21 can be adjusted to restore the jacking block to its original state, so as to prepare for the next measurement.

In this implementation, as shown in FIG. 1, the lifting system 21 includes circlip 211 and screw rod 212. The circlip 211 is also referred to as a check ring or a retaining ring, which is a fastener, and is installed into grooves on a shaft or a hole of a machine or an apparatus, to prevent the screw rod from falling-off from the measuring body. The screw rod 212 is configured for a wrench to reach in to generate a pressing force, and is preferably a screw rod which has a hexagon socket head, and the wrench is preferably a hex wrench. During actual use, the hex wrench is used to reach into the screw rod 212 and rotate the screw rod clockwise, such that a required pressure can be generated, and the intermediate system 22 can be pushed far enough to jack up the magnetically conductive measuring body 1 from a magnetic chuck when a magnetic force reaches a limit; or the hex wrench reaches into the screw rod 212 to rotate the screw rod counterclockwise, such that a required lifting force can be generated to pull up the jacking block.

The magnetic force measuring device according to the first implementation of the present disclosure uses the electronic pressure gage to measure and display a stress value, and a measurement result is protected from an influence of different operators, times or places. The electronic pressure gage can also be kept at the maximum value, such that the accurate stress value can be obtained. It is more convenient to use the electronic pressure gage, and requirements for the operators are lower, such that the device has a very high practical value in practice.

Second Implementation

Figure 2:
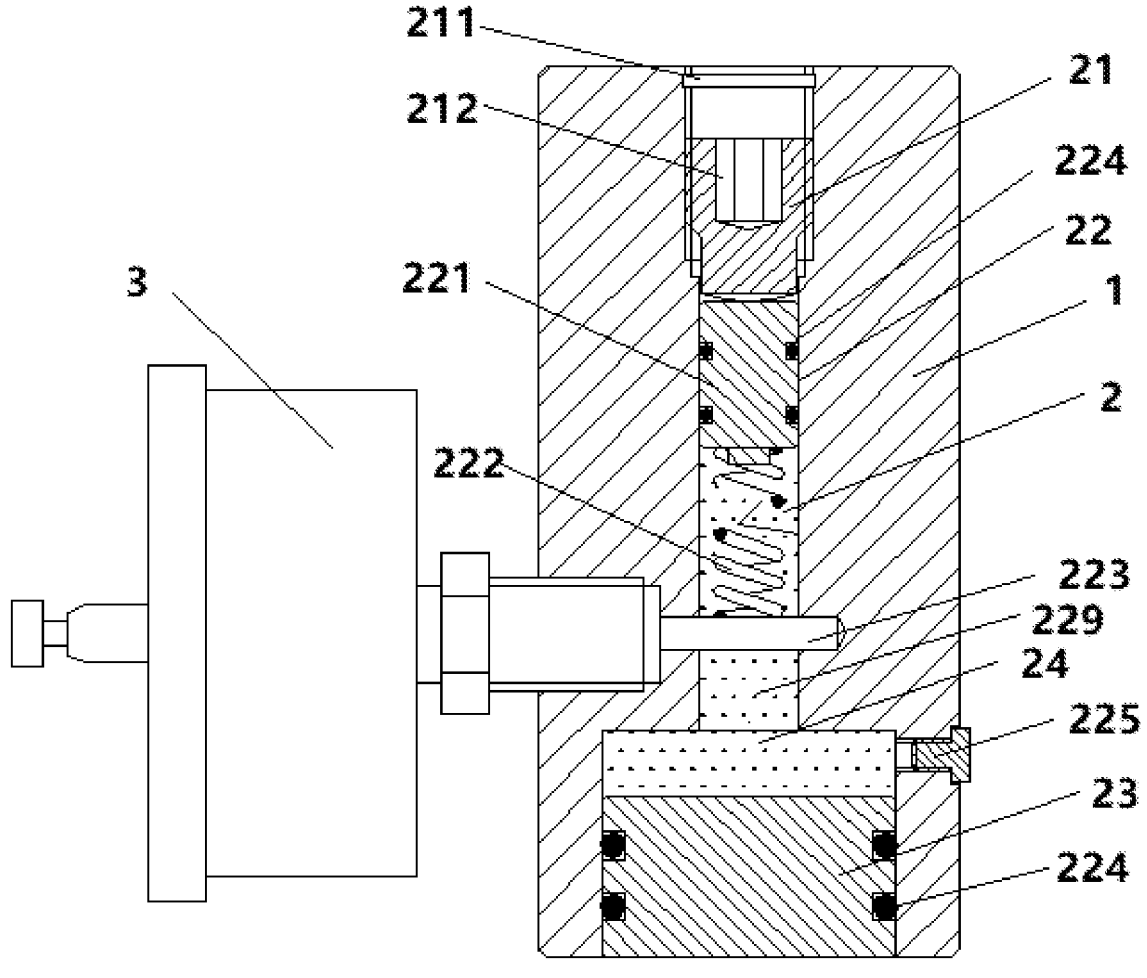
FIG. 2 is a schematic sectional view of a magnetic force measuring device according to a second implementation of the present disclosure.

As shown in FIG. 2, the second implementation of the present disclosure discloses a magnetic force measuring device, including measuring body 1 and pressure gage 3. A center of the measuring body 1 is provided with longitudinal channel 2 in an axial direction thereof. Lifting system 21, intermediate system 22, and jacking block 23 are arranged inside the longitudinal channel 2 from top to bottom. The pressure gage 3 is associated with the intermediate system 22. A bottom surface of the measuring body 1 and a bottom surface of the jacking block 23 are flush to form a same contact surface in contact with a magnetic module. The measuring body 1 is magnetically conductive, and the jacking block 23 is not magnetically conductive. When subjected to an external action force, the lifting system 21 can drive the intermediate system 22 to move up or down in the longitudinal channel 2. When moving upward, the intermediate system 22 pushes the jacking block 23 to press a working surface of the magnetic module to jack up the measuring body 1 upward, and the pressure gage 3 records a maximum stress value of the jacking block 23 being pushed to jack up the measuring body 1.

Specifically, the measuring body 1 in this implementation may be in the shape of a cylinder or a square column, or other shapes that can be imagined by those skilled in the art without creative efforts, which is not limited by the disclosed content of this implementation.

Specifically, the pressure gage 3 is a memory pressure gage, and the intermediate system 22 includes pressing block 221, spring 222 connected to a lower end of the pressing block 221, and hydraulic oil 229. The longitudinal channel between the pressing block 221 and the jacking block 23 forms seal chamber 24, and the seal chamber 24 is filled with the hydraulic oil 229. The other end of the spring 222 is connected to hollow spring pin 223. The hollow spring pin 223 is preferably a C-shaped hollow spring pin to support the spring 222. A body wall of the measuring body 1 is provided with a transverse through hole. In a preferred implementation, two ends of the through hole may communicate with the hollow spring pin 223 and the memory pressure gage 3, respectively, to form a transverse channel. The seal chamber 24 is communicated with the memory pressure gage 3 through the transverse channel. When the pressing block 221 is stressed and pushed downward, a hydraulic pressure in the seal chamber 24 is transmitted to the memory pressure gage to obtain the maximum stress value. Alternatively, the hollow spring pin 223 may reach into the entire through hole and a formed transverse channel is directly communicated with the memory pressure gage 3. When the pressing block 221 is stressed and pushed downward, the hydraulic pressure inside the seal chamber 24 is transmitted to the memory pressure gage to obtain a stress value.

The memory pressure gage in this implementation is formed by an original pressure gage (an ordinary pressure gage, a shock-proof pressure gage, a stainless steel pressure gage, or the like) and a memory device that are connected to each other. The memory pressure gage features that the memory pressure gage can faithfully record a maximum value during measurement without human intervention. While a pressure pointer of the memory pressure gage rises with an increase in a measured medium pressure, a memory pointer is also driven to rise. When the pressure pointer drops with a decrease in measured medium pressure, the memory pointer still stays at the position of the maximum value. The memory pressure gage may be placed outside the measuring body (as shown in FIG. 2) or embedded in the measuring body as required.

In the magnetic force measuring device according to this implementation, the measuring body 1 is made of a magnetically conductive material, and is preferably made of a low-carbon steel material in the present disclosure. The jacking block 23 is made of a non-magnetically conductive material, and is preferably made of a brass material in this implementation.

The bottom surface of the measuring body 1 is flush with the bottom surface of the jacking block 23 to form the same contact surface in contact with the magnetic module. When the magnetic force measuring device according to the present disclosure is placed on the working surface of the magnetic module, the measuring body 1 and the magnetic module are clamped together by magnetic force.

During measurement, a downward pressing force is applied to the lifting system 21 to push the intermediate system 22 to move downward in the axial direction of the longitudinal channel 2. The intermediate system 22 includes the pressing block 221 and the spring 222 connected to the lower end of the pressing block. The pressing block 221 is stressed and moves downward, and the spring 222 is elastically compressed accordingly, thereby reducing an internal space of the seal chamber 24 and increasing a hydraulic strength inside the seal chamber 24. The hydraulic strength is transmitted to the memory pressure gage 3 through the transverse channel, and the pressure pointer of the memory pressure gage 3 points to a pressure magnitude.

As the pressing block 221 continues to move downward, the jacking block 23 is subjected to a downward pressing force, such that the jacking block 23 presses the magnetic module tightly to apply a downward pressing force to the magnetic module, and the bottom surface of the measuring body 1 is subjected to an upward reaction force. When the reaction force is enough to cancel out a magnetic attraction force between the measuring body 1 and the magnetic module and the gravity of the measuring body 1 itself, the magnetic measuring body 1 is lifted upward. At this time, the pressure gage obtains a maximum hydraulic pressure to measure a maximum stress value, and the pressure pointer points to the maximum pressure. Then the pressure decreases, and the memory pointer remains at the position where there is the maximum pressure, such that an operator can clearly know the maximum pressure value, and a magnetic force value can be obtained through calculation based on the maximum pressure value.

In the whole process mentioned above, the magnetic module needs to be kept stationary, such that there is accurate relative motion between the magnetic force measuring device and the magnetic module, to avoid affecting accuracy of results.

When the test is completed, the lifting system 21 can be adjusted to restore the jacking block to its original state, so as to prepare for the next measurement.

In this implementation, as shown in FIG. 2, the lifting system 21 includes circlip 211 and screw rod 212, where the circlip 211 is also referred to as a check ring or a retaining ring, which is a fastener, and is installed into grooves on a shaft or a hole of a machine or an apparatus, to prevent the screw rod from falling-off from the measuring body. The screw rod 212 is configured for a wrench to reach in to generate a pressing force, and is preferably a screw rod which has a hexagon socket head, and the wrench is preferably a hex wrench. During actual use, the hex wrench is used to reach into the screw rod 212 and rotate the screw rod clockwise, such that a required pressure can be generated, and the intermediate system 22 can be pushed far enough to jack up the magnetically conductive measuring body 1 from a magnetic chuck when a magnetic force reaches a limit.

Further, as shown in FIG. 2, one or more sealing rings 224 are arranged on an outer side of the pressing block 221 in this implementation, and correspondingly, a plurality of sealing rings 224 are also arranged on an outer side of the jacking block 23. Since the longitudinal channel between the pressing block 221 and the jacking block 23 is isolated as the seal chamber 24 for storing the hydraulic oil 229, the sealing rings 224 are arranged on the outer side of the pressing block 221 and the outer side of the jacking block 23 respectively, which can achieve a better sealing effect and prevent the hydraulic oil 229 from leaking.

Further, a lower portion of the seal chamber 24 is provided with a through hole communicated with an external space of the measuring body 1. The operator injects the hydraulic oil 229 into the seal chamber 24 in advance, and the through hole may be used to exhaust the air inside the seal chamber 24 when the injection is performed. Then the through hole is sealed by plug 225 to prevent the hydraulic oil 229 from leaking and maintain a state of the hydraulic oil 229 in the seal chamber 24.

In this implementation, the seal chamber 24 has an inversely T-shaped structure, and an upper portion of the inversely T-shaped structure is a long and narrow channel, in which the hydraulic oil 229, the spring 222, and the hollow spring pin 223 can be placed. The entire internal space of the inversely T-shaped structure stores the hydraulic oil 229 to form a downward pressure on the jacking block 23.

The magnetic force measuring device according to the second implementation of the present disclosure uses the memory pressure gage to measure and display the hydraulic pressure value so as to obtain the magnitude of the magnetic force, such that an influence of different operators, times or places on a measurement result is avoided, an accurate magnetic force measured value can be obtained, and thus the device has a very high practical value in practice.

Figure 3:
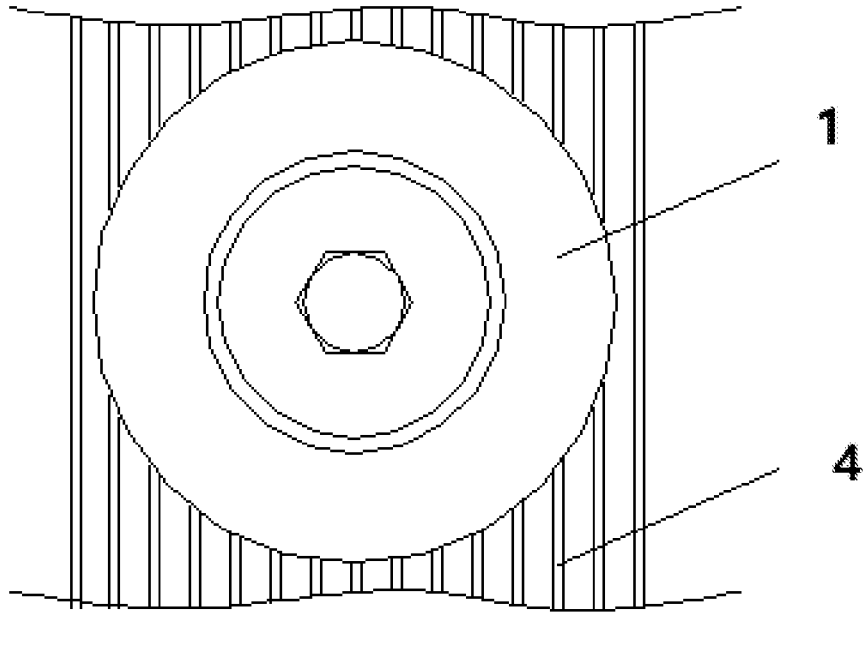
FIG. 3 is a top view of a magnetic force measuring device according to each implementation of the present disclosure.

It should be noted that in practical application, the magnitude of the magnetic force per unit area is of comparative significance. When the measured magnitude of the magnetic force is divided by a magnetically conductive area of effective contact, the magnitude of the magnetic force per unit area can be obtained. FIG. 3 illustrates a top view of a magnetic force measuring device placed on magnetic module 4 according to this implementation. As shown in FIG. 3, the measuring body 1 in this implementation may be in the shape of a cylinder or a square column, or other shapes that can be imagined by those skilled in the art without creative efforts, which is not limited by the disclosed content of this implementation.

To sum up, in the magnetic force measuring device according to the present disclosure, the bottom surface of the measuring body and the bottom surface of the jacking block are flush and form the same contact surface in contact with the magnetic module. When the lifting system is subjected to a downward pressing force, the lifting system pushes the intermediate system to move downward, and thus pushes the jacking block to press a working surface of the magnetic module downward. Due to interaction of forces, when a received reaction force may cancel out a magnetic force and gravity of the measuring body itself, the measuring body is jacked up upward, such that a magnitude of the required reaction force can be recorded to obtain a maximum stress value, and thus an accurate magnetic force value can be obtained by calculation; or when the lifting system is subjected to an upward lifting force, the lifting system drives the intermediate system to move upward, to pull the jacking block upward to cancel out the magnetic force and the gravity of the jacking block itself and leave the contact surface. At this time, an accurate magnetic force value can be obtained through calculation based on a measured and recorded maximum stress value. In the present disclosure, when a user uses the hex wrench to rotate the screw rod which has a hexagon socket head, rotation at a uniform speed can be easily achieved, and the pressing force or the lifting force can be applied stably. Therefore, an influence of different operators, times or places on measurement results is avoided, an accurate magnetic force measured value can be obtained, and thus the device has a very high practical value in practice.

In addition, the foregoing implementations of the present disclosure are merely intended to exemplarily explain the principles and effects of the present disclosure, rather than to limit the present disclosure. Any person skilled in the art can make modifications or alterations to the foregoing implementations without departing from the spirit and scope of the present disclosure. Therefore, all equivalent modifications or alterations made by those skilled in the art without departing from the spirit and technical ideas disclosed in the present disclosure should still be covered by the claims of the present disclosure.

What is claimed is:

1. A magnetic force measuring device, comprising a measuring body and a pressure gage, wherein a center of the measuring body is provided with a longitudinal channel; a lifting system, an intermediate system, and a jacking block are arranged in the longitudinal channel from top to bottom; the pressure gage is associated with the intermediate system; a bottom surface of the measuring body and a bottom surface of the jacking block are flush to form a same contact surface in contact with a magnetic module; one of the measuring body and the jacking block is magnetically conductive, and the other is not magnetically conductive; when subjected to an external action force, the lifting system drives the intermediate system to move up or down in the longitudinal channel, so as to apply a force to the jacking block to lift the jacking block upward or push the jacking block to jack up the measuring body, and the pressure gage records a maximum stress value of the jacking block.

2. The magnetic force measuring device according to claim 1, wherein the lifting system comprises a circlip and a screw rod, and the screw rod allows a wrench to reach in to apply an external force.

3. The magnetic force measuring device according to claim 2, wherein the screw rod has a hexagon socket head, and the wrench is a hex wrench.

4. The magnetic force measuring device according to claim 1, wherein the pressure gage is a memory pressure gage, and the intermediate system comprises a pressing block, a spring connected to a lower end of the pressing block, and hydraulic oil; the longitudinal channel between the pressing block and the jacking block forms a seal chamber, the seal chamber is filled with the hydraulic oil, and the seal chamber is communicated with the memory pressure gage; and when the pressing block is stressed and pushed downward, a hydraulic pressure in the seal chamber is transmitted to the memory pressure gage, such that the memory pressure gage obtains the maximum stress value.

5. The magnetic force measuring device according to claim 4, wherein one or more first sealing rings are arranged on an outer side of the pressing block, and one or more second sealing rings are arranged on an outer side of the jacking block.

6. The magnetic force measuring device according to claim 4, wherein a lower portion of the seal chamber is provided with a through hole communicated with an external space of the measuring body, and the through hole is sealed by a plug.

7. The magnetic force measuring device according to claim 4, wherein the seal chamber is an inversely T-shaped seal chamber.

8. The magnetic force measuring device according to claim 1, wherein the pressure gage is an electronic pressure gage, and the intermediate system comprises a pressing block, a screw, and a pressure sensor; an upper portion of the pressing block wraps a lower portion of the screw, and the pressure sensor is arranged below the screw; each of an upper end and a lower end of the pressure sensor is provided with a threaded column, and a lower portion of the pressing block wraps the threaded column at the upper end of the pressure sensor; and the electronic pressure gage is connected to the pressure sensor to obtain the maximum stress value.

9. The magnetic force measuring device according to claim 8, wherein the electronic pressure gage is provided with a digital display screen to display the maximum stress value.

10. The magnetic force measuring device according to claim 1, wherein when the measuring body is magnetically conductive and the jacking block is not magnetically conductive, the measuring body is made of low carbon steel, and the jacking block is made of brass; when the measuring body is not magnetically conductive and the jacking block is magnetically conductive, the measuring body is made of brass, and the jacking block is made of low carbon steel.

11. The magnetic force measuring device according to claim 2, wherein when the measuring body is magnetically conductive and the jacking block is not magnetically conductive, the measuring body is made of low carbon steel, and the jacking block is made of brass; when the measuring body is not magnetically conductive and the jacking block is magnetically conductive, the measuring body is made of brass, and the jacking block is made of low carbon steel.

12. The magnetic force measuring device according to claim 3, wherein when the measuring body is magnetically conductive and the jacking block is not magnetically conductive, the measuring body is made of low carbon steel, and the jacking block is made of brass; when the measuring body is not magnetically conductive and the jacking block is magnetically conductive, the measuring body is made of brass, and the jacking block is made of low carbon steel.

13. The magnetic force measuring device according to claim 4, wherein when the measuring body is magnetically conductive and the jacking block is not magnetically conductive, the measuring body is made of low carbon steel, and the jacking block is made of brass; when the measuring body is not magnetically conductive and the jacking block is magnetically conductive, the measuring body is made of brass, and the jacking block is made of low carbon steel.

14. The magnetic force measuring device according to claim 5, wherein when the measuring body is magnetically conductive and the jacking block is not magnetically conductive, the measuring body is made of low carbon steel, and the jacking block is made of brass; when the measuring body is not magnetically conductive and the jacking block is magnetically conductive, the measuring body is made of brass, and the jacking block is made of low carbon steel.

15. The magnetic force measuring device according to claim 6, wherein when the measuring body is magnetically conductive and the jacking block is not magnetically conductive, the measuring body is made of low carbon steel, and the jacking block is made of brass; when the measuring body is not magnetically conductive and the jacking block is magnetically conductive, the measuring body is made of brass, and the jacking block is made of low carbon steel.

16. The magnetic force measuring device according to claim 7, wherein when the measuring body is magnetically conductive and the jacking block is not magnetically conductive, the measuring body is made of low carbon steel, and the jacking block is made of brass; when the measuring body is not magnetically conductive and the jacking block is magnetically conductive, the measuring body is made of brass, and the jacking block is made of low carbon steel.

17. The magnetic force measuring device according to claim 8, wherein when the measuring body is magnetically conductive and the jacking block is not magnetically conductive, the measuring body is made of low carbon steel, and the jacking block is made of brass; when the measuring body is not magnetically conductive and the jacking block is magnetically conductive, the measuring body is made of brass, and the jacking block is made of low carbon steel.

18. The magnetic force measuring device according to claim 9, wherein when the measuring body is magnetically conductive and the jacking block is not magnetically conductive, the measuring body is made of low carbon steel, and the jacking block is made of brass; when the measuring body is not magnetically conductive and the jacking block is magnetically conductive, the measuring body is made of brass, and the jacking block is made of low carbon steel.

* * * * *